United States Patent
Lee

(10) Patent No.: US 7,414,934 B2
(45) Date of Patent: Aug. 19, 2008

(54) METHOD FOR CONTROLLING OPTICAL POWER LEVEL

(75) Inventor: Gab Jae Lee, Kyungaangnam-do (KR)

(73) Assignee: Hitachi-LG Data Storage Korea, Inc., Seoul (KR)

( * ) Notice: Subject to any disclaimer, the term of this patent is extended or adjusted under 35 U.S.C. 154(b) by 370 days.

(21) Appl. No.: 10/606,382

(22) Filed: Jun. 26, 2003

(65) Prior Publication Data

US 2004/0057651 A1 Mar. 25, 2004

(30) Foreign Application Priority Data

Jun. 26, 2002 (KR) .................. 10-2002-0035886

(51) Int. Cl.
*G11B 7/00* (2006.01)
(52) U.S. Cl. .................. 369/47.51; 369/44.29
(58) Field of Classification Search .................. 369/116, 369/53.26, 47.51
See application file for complete search history.

(56) References Cited

U.S. PATENT DOCUMENTS

| | | | |
|---|---|---|---|
| 4,081,670 A | | 3/1978 | Albanese |
| 4,612,671 A | | 9/1986 | Giles |
| 5,019,769 A | | 5/1991 | Levinson |
| 5,268,893 A | * | 12/1993 | Call et al. .................. 369/47.52 |
| 5,715,218 A | * | 2/1998 | Ikeda ....................... 369/44.29 |
| 5,732,055 A | * | 3/1998 | Masaki et al. ............. 369/53.26 |
| 5,808,989 A | * | 9/1998 | Ueki et al. ................ 369/47.11 |
| 6,292,284 B1 | * | 9/2001 | Takauji et al. ............... 398/197 |
| 6,795,656 B1 | * | 9/2004 | Ikeuchi et al. ............... 398/197 |

FOREIGN PATENT DOCUMENTS

| | | |
|---|---|---|
| EP | 0405419 A2 | 6/1990 |
| EP | 0469929 A2 | 8/1991 |
| EP | 0478275 A2 | 9/1991 |
| EP | 0532241 A2 | 9/1992 |
| EP | 0548591 A1 | 11/1992 |
| EP | 0660471 A2 | 12/1994 |
| EP | 0913896 A2 | 10/1998 |

* cited by examiner

*Primary Examiner*—Wayne Young
*Assistant Examiner*—Van T. Pham
(74) *Attorney, Agent, or Firm*—Birch, Stewart, Kolasch & Birch, LLP

(57) ABSTRACT

A method for controlling an optical power level includes the steps of a) regularly increasing a control value of a driving signal generator for driving a pickup unit adapted to output an optical power, b) checking a driving signal of the driving signal generator according to the increasing control value, and c) setting a control value at which the driving signal begin to be generated as an offset value for setting up an optical power. Therefore, an offset value for a reference optical power needed for setting up laser power levels for individual operation modes is more accurately calculated, and the laser power levels for individual operation modes are optimally controlled based on the offset value.

9 Claims, 7 Drawing Sheets

METHOD FOR CONTROLLING OPTICAL POWER LEVEL

BACKGROUND OF THE INVENTION

1. Field of the Invention

The present invention relates to a method for controlling an optical power level, which sets up an offset value for a reference optical power, and controls laser power levels required for individual operation modes of an optical disc apparatus based on the offset value.

2. Description of the Related Art

Typically, an optical disc apparatus records data on an optical disc such as a CD (Compact Disc) and a DVD (Digital Versatile Disc) using a laser diode, or reproduces the data recorded on the optical disc.

A power level of the laser diode has been determined when initially setting up a laser power, and has been constantly maintained and generated by an APC (Automatic Power Control) circuit contained in an RF (Radio Frequency) IC (Integrated Circuit).

FIG. 1 is a circuit diagram for implementing an APC function of the APC circuit. As shown in FIG. 1, an RF IC 10 receives a feedback signal FPDO from a photo detector (not shown) contained in a pickup unit 20 and an output signal of a DAC (Digital Analog Converter) 102, and outputs its resultant signal while maintaining a constant voltage level at an operational amplifier (OP-AMP) 103.

The DAC 102 receives digital data (hereinafter referred to as a DAC value) from a microcomputer 30, and converts the digital data into analog data or analog signal. In this case, the microcomputer 30 differently sets up the DAC values for individual operation modes, i.e., a data recording mode, a data playback mode, and a disc discrimination mode.

In case of setting up laser power levels according to individual operation modes, the microcomputer 30 sets up the laser power levels on the basis of a DAC offset value. The DAC offset value is an offset value transmitted from the microcomputer 30 to the DAC 102 at a time when an output voltage is about to come into existence from the RF IC 10. If a level shift circuit 101 is further used for the APC circuit shown in FIG. 1, an output voltage shifted by a prescribed voltage is generated as a resultant signal from the RF IC 10.

FIG. 2 is a graph illustrating a conventional method for calculating the DAC offset value. Referring to FIG. 2, the DAC offset value is the X-coordinate of a point at which a linear function graph meets the X-axis. The linear function graph is formed by predetermined DAC values DAC1, and DAC2 transmitted from the microcomputer 30 to the DAC 102, laser power levels P1, and P2 generated from the pickup unit 20 upon receiving the predetermined DAC values DAC1, and DAC2, or feedback voltage levels FPDO1 and FPDO2.

The DAC offset value can be calculated by a linear equation shown in the following Equation 1:

$$rDAC_{offset} = \frac{DAC1 \times P1 - DAC2 \times P2}{P2 - P1}, \quad \text{[Equation 1]}$$

where "$rDAC_{offset}$" is a DAC offset value.

In the meantime, FIG. 3 is a graph illustrating another conventional method for calculating a DAC offset value. Feedback voltage levels F1 and F2 of a laser diode are proportional to output power values P1 and P2 of a laser, such that a DAC offset value can be calculated by the following Equation 2:

$$rDAC_{offset} = \frac{DAC1 \times F1 - DAC2 \times F2}{F2 - F1}, \quad \text{[Equation 2]}$$

where "$rDAC_{offset}$" is a DAC offset value.

However, in case of calculating the DAC offset value as above, laser power levels P1, and P2 and feedback voltage levels FPDO1 and FPDO2 vary with characteristics and status of the pickup unit 20 shown in FIG. 1, resulting in unavoidably increasing deviations of resultant DAC offset values. Furthermore, because DAC values for individual operation modes, for example, a data recording mode, a data playback mode, and a disc discrimination mode are determined based on the DAC offset value, DAC values for individual operation modes vary with the DAC offset value, and laser power levels for individual operation modes cannot be appropriately determined.

SUMMARY OF THE INVENTION

Therefore, the present invention has been made in view of the above problems, and it is an object of the present invention to provide a method for controlling an optical power level, which more accurately calculates an offset value for a reference optical power needed to set up laser powers for performing individual operation modes, and optimally controls laser power levels for individual operation modes on the basis of the offset value.

In accordance with the present invention, the above and other objects can be accomplished by a method for controlling an optical power level, comprising the steps of: a) regularly increasing a control value of a driving signal generator for driving a pickup unit adapted to output an optical power; b) checking a driving signal of the driving signal generator according to the increasing control value; and c) setting a control value at which the driving signal begins to be generated as an offset value for setting up an optical power.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF PREFFERRED EMBODIMENTS

Figure 1:
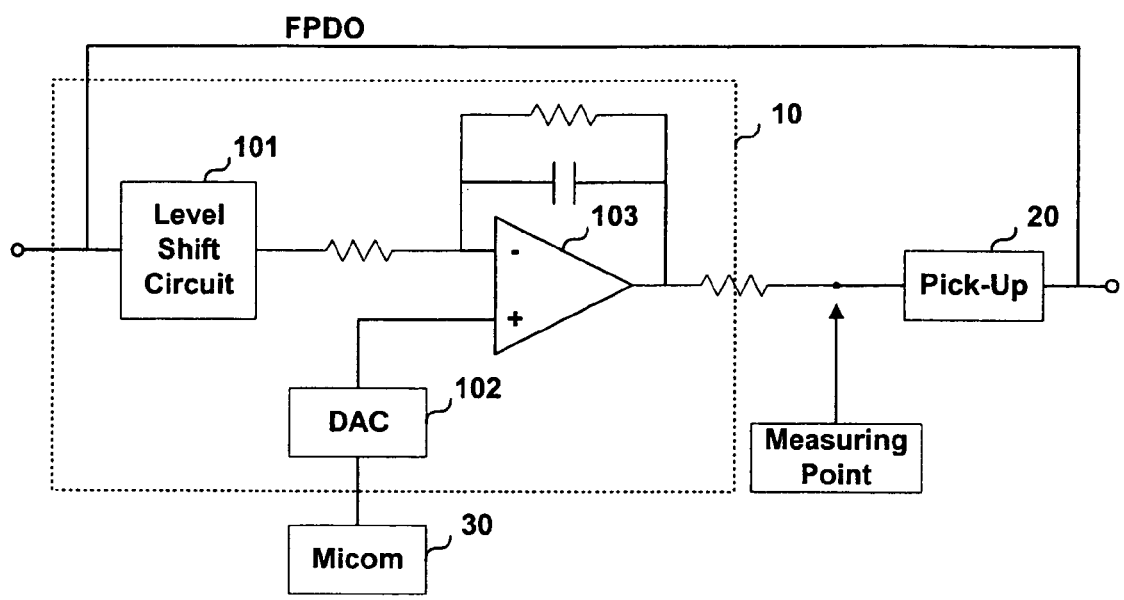
FIG. 1 is a circuit diagram for implementing an APC function of an RF IC contained in an optical disc apparatus.
Figure 2:
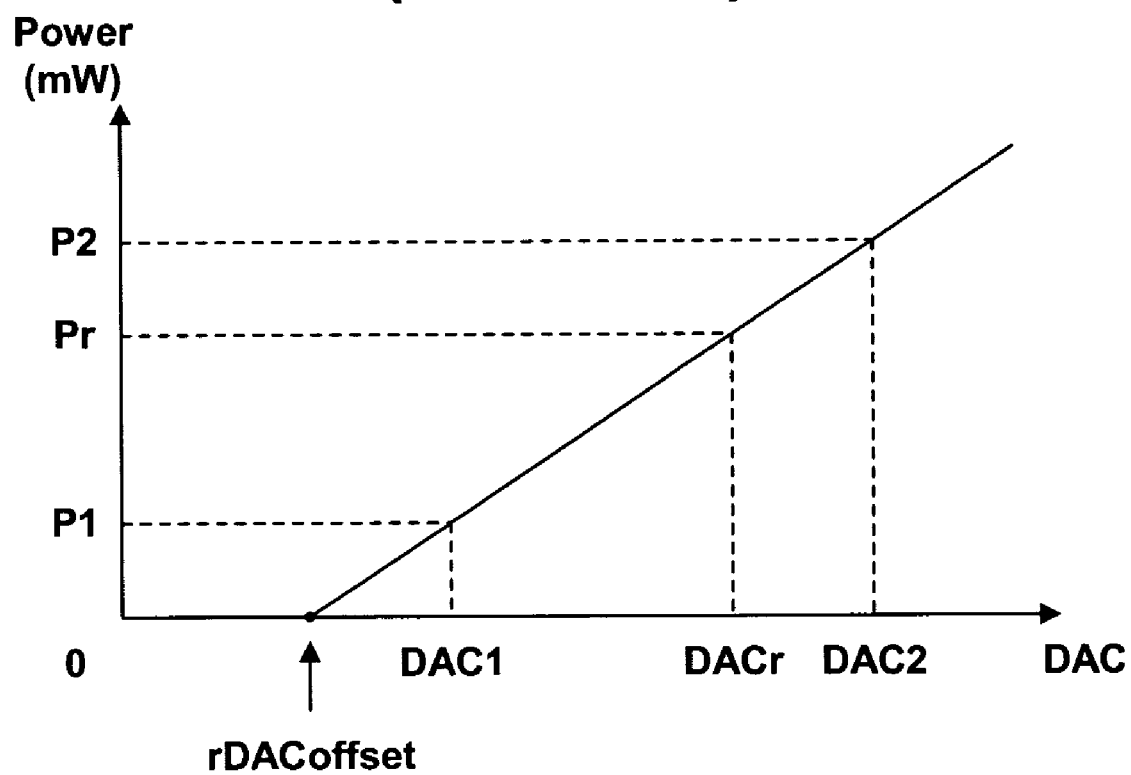
FIG. 2 is a graph illustrating a conventional method for calculating an offset value for a reference optical power.
Figure 3:
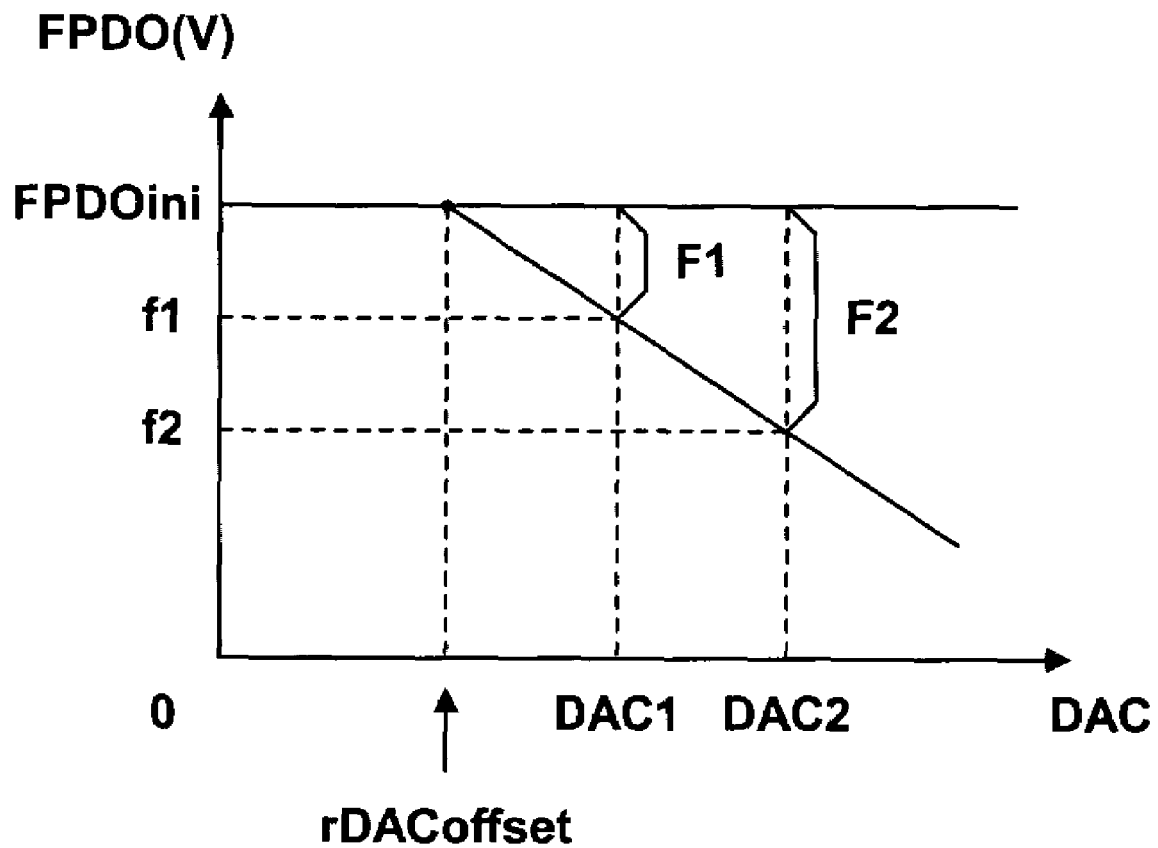
FIG. 3 is a graph illustrating another conventional method for calculating an offset value for a reference optical power.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Figure 4:
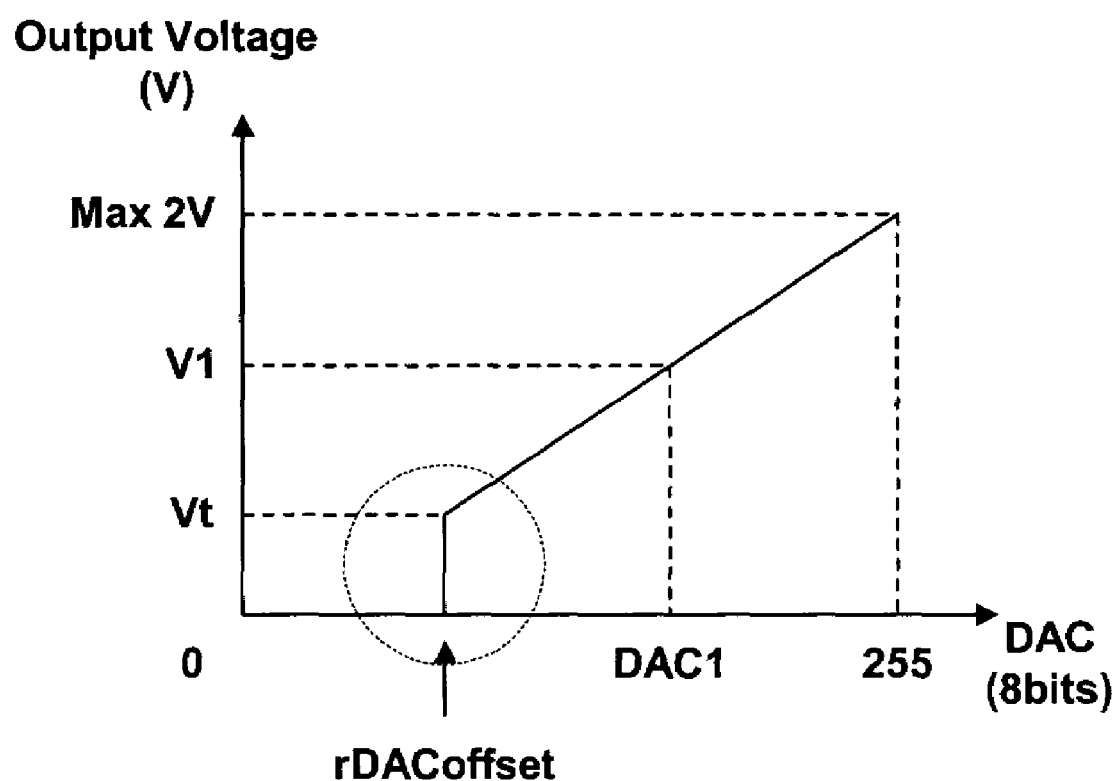
FIG. 4 is a graph illustrating a method for setting up an offset value for a reference optical power in accordance with the present invention.
Figure 5:
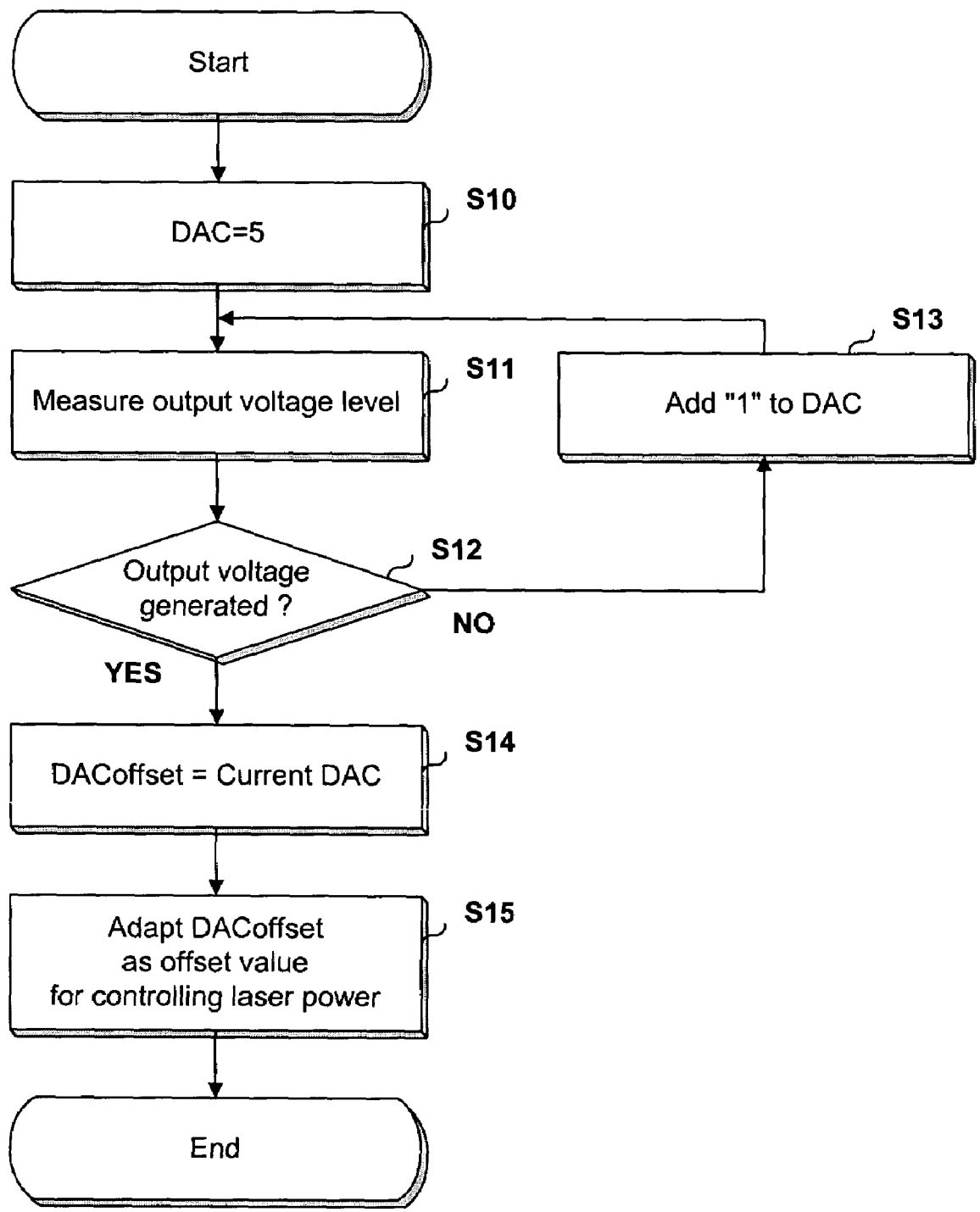
FIG. 5 is a flow chart illustrating a method for setting up an offset value for a reference optical power and a method for controlling a desired optical power level on the basis of the offset value in accordance with a preferred embodiment of the present invention.

FIG. 4 is a graph illustrating a method for setting up an offset value for a reference optical power when determining a laser power level for each operation mode according to a method for controlling an optical power level of the present invention. FIG. 5 is a flow chart illustrating a method for setting up an offset value for a reference optical power and a method for controlling a desired optical power level on the basis of the offset value in accordance with a preferred embodiment of the present invention.

A level shift circuit 101 shown in FIG. 1 shifts an output voltage level to a predetermined voltage level Vt to stabilize the output voltage level. Referring to FIG. 4, an output voltage instantaneously increases at an offset point. For example, in case that a shift level determined by the level shift circuit 101 is 0.5V, a DAC offset value at a time of generating an output voltage level of 0.5V can be 64. However, because an RF IC includes an internal offset, and a laser diode has peculiar characteristics different each other, an output voltage level and a DAC offset value are changed by the internal offset and the characteristics.

Therefore, the microcomputer 30 changes a DAC value applied to a DAC 102 in the range from a low value to a high value at steps S10 and S13, and measures an output voltage level of the RF IC 10 at a measuring point at step S11. In more detail, the microcomputer 30 gradually increases the DAC value in the range from "5" to "125" on the basis of the ideal DAC offset value of 64, and at the same time measures an output voltage level of the RF IC 10.

In this case, if the DAC value reaches a certain value, an output voltage of the RF IC 10 is generated. If the output voltage of the RF IC 10 is generated at step S12, the microcomputer 30 adapts a DAC value applied to the DAC 102 as a DAC offset value at step S14, and stores this DAC offset value in a memory such as an EEPROM (Electrically Erasable Programmable ROM). This DAC offset value stored in the memory is adapted as an offset value for a reference optical power in case of adjusting a laser power level for recording/reproducing data.

In case of recording/reproducing the data on/from an optical disc, or discriminating a type of the optical disc, a laser power should have different output power levels. For example, in case of discriminating the type of an optical disc, a laser power of 1 mW is needed. A method for setting up this laser power of 1 mW to discriminate the type of such an optical disc will hereinafter be described in detail.

The microcomputer 30 applies a predetermined DAC value to the DAC 102, and measures a laser power generated by an output voltage of the RF IC 10. Based on the offset value for a reference optical power stored in the EEPROM, the predetermined DAC value, and the laser power generated by the predetermined DAC value, the microcomputer 30 calculates a DAC value for outputting a laser power of 1 mW at step S15.

The microcomputer 30 applies the calculated DAC value to the DAC 102 to generate a laser power of 1 mW.

In this case, the DAC value for generating the laser power of 1 mW can be calculated by the following Equation 3:

$$DAC_{1mW} = DAC_{offset} + \frac{1mW}{P_1} \times (DAC_1 - DAC_{offset}),\quad \text{[Equation 3]}$$

where "$DAC_{1mW}$" is a DAC value at which a laser power of 1 mW is generated;

"$DAC_{offset}$" is a DAC value at an offset point;

"$DAC_1$" is a predetermined DAC value applied to the DAC 102 to obtain the variable "$DAC_{1mW}$"; and "$P_1$" is a laser power value detected when applying a value of the "$DAC_1$" to the DAC 102.

As stated above, a DAC value for generating a laser power of 1 mW can be set up on the basis of an offset value for a reference optical power.

However, because an output voltage is very unstable in a threshold area where an output level of the RF IC 10 instantaneously increases, it is difficult for the microcomputer 30 to obtain a correct DAC offset value. A method for more accurately calculating an offset value for a reference optical power will hereinafter be described with reference to preferred embodiments of the present invention.

Figure 6:
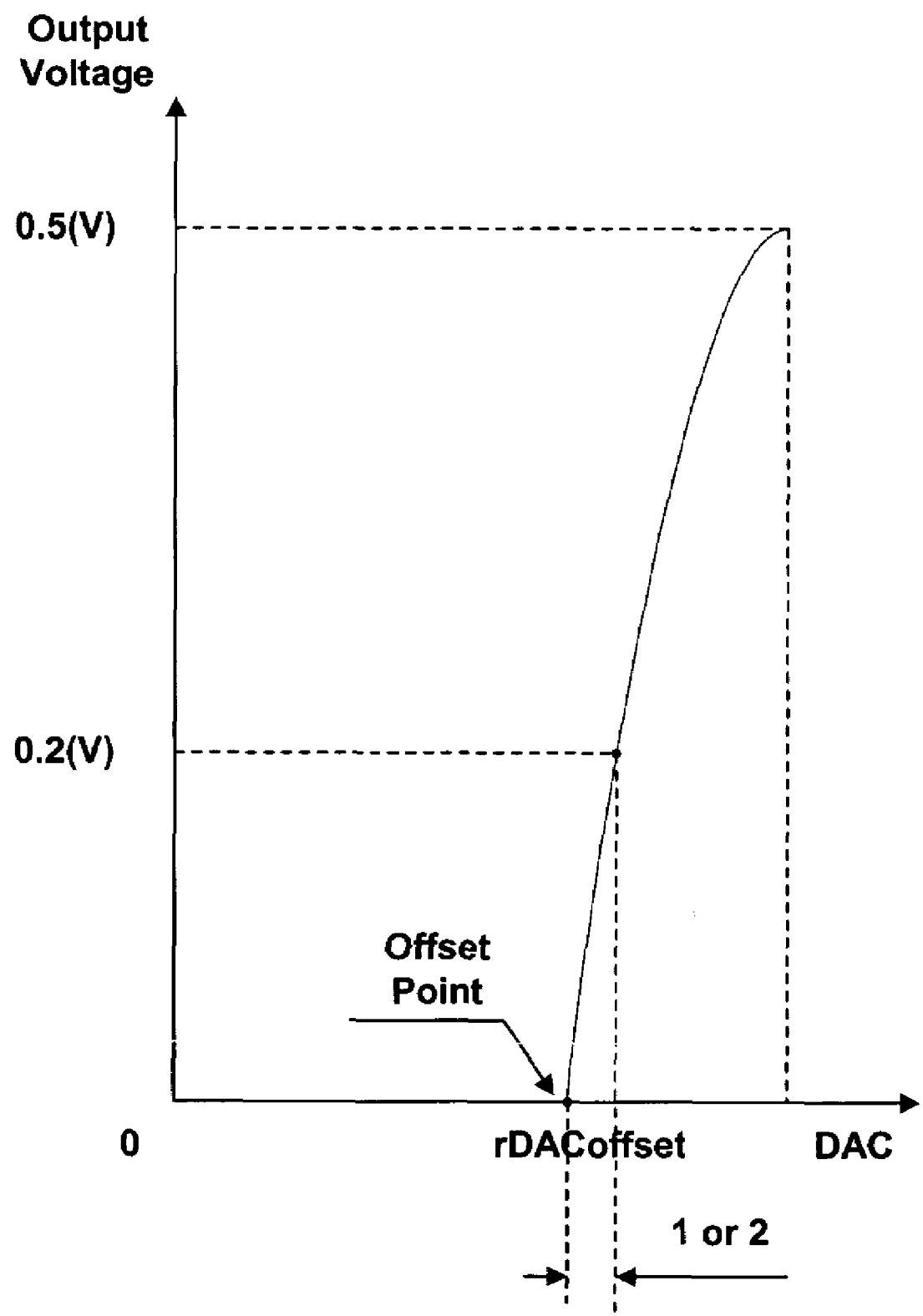
FIG. 6 is a graph illustrating a locus of an output voltage in a threshold area in the output voltage graph shown in FIG. 4.
Figure 7:
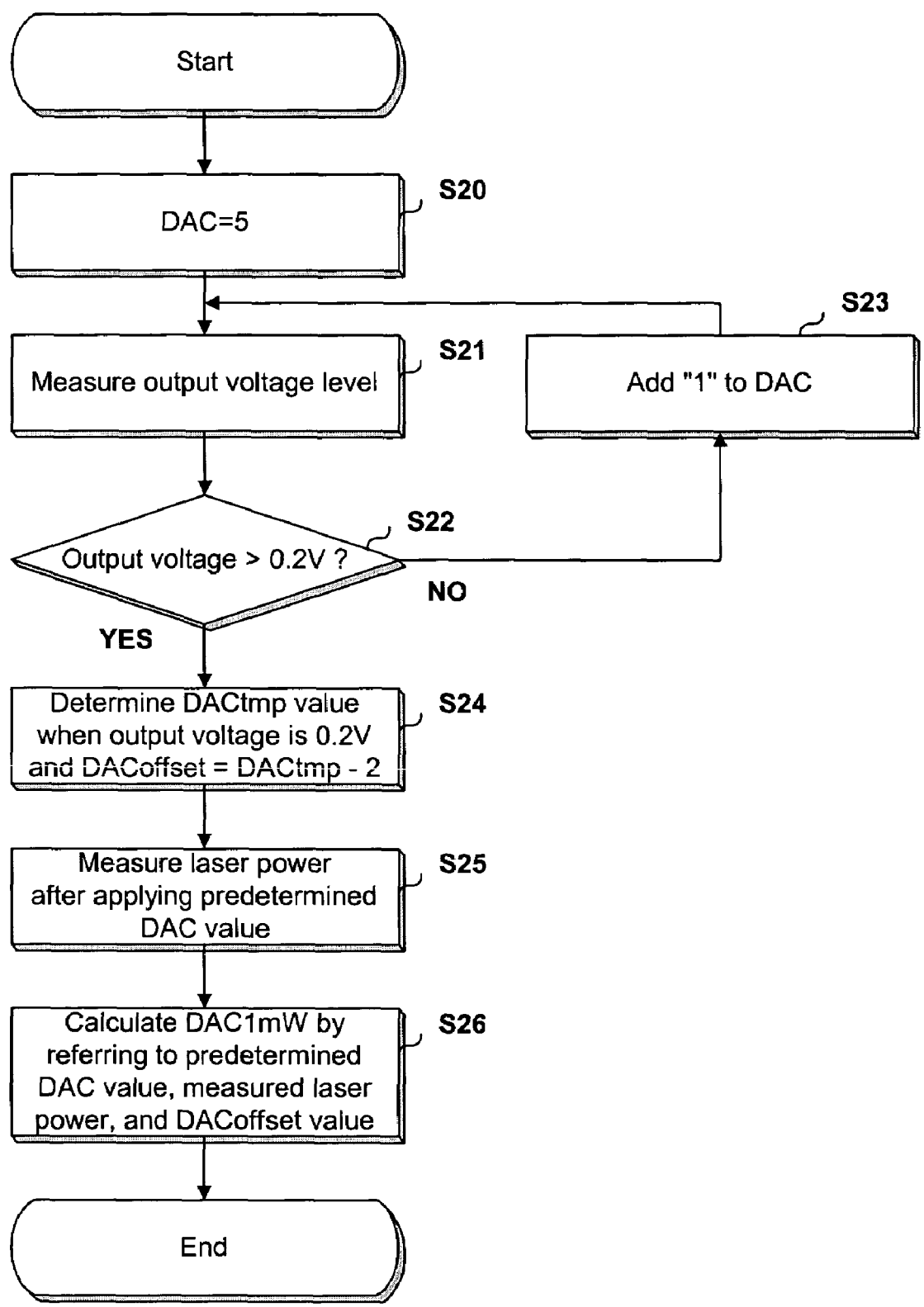
FIG. 7 is a flow chart illustrating a method for setting up an offset value for a reference optical power and a method for controlling a desired optical power level on the basis of the offset value in accordance with another preferred embodiment of the present invention.

FIG. 6 is a graph illustrating a locus of an output voltage in a threshold area in the output voltage graph shown in FIG. 4. FIG. 7 is a flow chart illustrating a method for setting up an offset value for a reference optical power and a method for controlling a desired optical power level on the basis of the offset value according to the present invention.

After a DAC value (i.e., a DACtmp value) is measured at a time when an output voltage level escapes from an unstable area, for example, at a time when an output power level becomes 0.2V, a predetermined DAC value is subtracted from this measured DACtmp value in such a way that the offset value for a reference optical power is calculated. It is desirable that the DAC value subtracted from the DACtmp value is "1" or "2".

The microcomputer 30 gradually increases a DAC value in the range from "5" to "125", and applies this increasing DAC value to the DAC 102 at steps S20 and S23 in such a way that an output voltage level is measured at step S21. Then, it is determined whether an output voltage level becomes 0.2V at step S22.

An output voltage level of the RF IC 10 initially maintains a level "0" according to the DAC value applied to the DAC 102, and instantaneously increases in a threshold area shown in FIG. 6. In this case, a predetermined point at which an output voltage of the RF IC 10 becomes 0.2V is found, and a DAC value "DACtmp" of the predetermined point is measured at step S24. After measuring the DACtmp value, a predetermined value such as a number "2" is subtracted from the measured DACtmp value, and the subtracted result value is adapted as an offset value for a reference optical power at step S24.

Then, a predetermined DAC value DAC1 is applied to the DAC 102, and an optical power level P1 generated from a laser diode of the pickup unit 20 is measured at step S25. If the offset value for a reference optical power, the predetermined DAC1, and the measured P1 are applied to the aforementioned equation, a DAC value for generating a desired laser power is calculated at step S26.

According to individual measurement results of a plurality of laser diodes, a deviation in ratio of an increase of either output power levels or driving signal levels of a laser diode to an increase of DAC values applied to the DAC 102 is a very low value capable of being sufficiently covered by an optical disc apparatus. In other words, an output power level of a laser diode increases with an almost constant ratio.

So a predetermined value, for example, a DAC value for generating an optical power of 1 mW, can be previously measured in the form of a difference between the DAC value and an offset value, and the measured difference can be previously stored in a memory. And an offset value for a reference optical power is measured or calculated when setting up a laser power. For example, provided that a DAC value (e.g., offset value+34) is needed to generate an optical power level of 1 mW, a value of 34 is previously stored in the memory, and an offset value is measured or calculated in case of setting up a laser power. Then a DAC input value for generating an optical power of 1 mW can be readily calculated by adding the stored value of 34 and the measured offset value. In this case, the DAC input value for generating a specific power level can also be calculated by a prescribed operation method.

As apparent from the above description, a method for controlling an optical power level according to the present invention more accurately calculates an offset value for a reference optical power needed to set up laser powers for performing individual operation modes, and controls optimum laser power levels for individual operation modes on the basis of the offset value.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for controlling an optical power level, comprising the steps of:
    a) increasing a control value of a driving signal generator for driving a pickup unit to output an optical power until the driving signal generator starts to generate a driving voltage;
    b) setting the increased control value at which the driving signal generator starts to generate the driving voltage as an offset value for setting up a desired optical power of the pickup unit; and
    c) calculating a control value for generating the desired optical power of the pickup unit based on the offset value,
    wherein the control value for generating the desired optical power is previously stored in a nonvolatile memory in the form of a difference between the control value and an offset value for setting up the desired optical power.

2. The method as set forth in claim 1, wherein the driving voltage of the driving signal generator is applied to a laser diode of the pickup unit, and a magnitude of the optical power is determined by a level of the driving voltage.

3. The method as set forth in claim 1, wherein the offset value is stored in a nonvolatile memory.

4. The method as set forth in claim 1, wherein the offset value is determined when an optical disc apparatus is initially driven.

5. The method as set forth in claim 1, wherein the step (b) includes the steps of:
    b1) determining the control value at which the driving voltage of the driving signal generator reaches a predetermined voltage level; and
    b2) subtracting a predetermined value from the determined control value, and setting the subtracted result value as the offset value.

6. The method as set forth in claim 5, wherein the predetermined voltage level is within a threshold area of the driving voltage of the driving signal generator.

7. The method as set forth in claim 1, wherein the step (c) comprises the step of:
    c3) calculating the control value for generating the desired optical power based on the offset value determined at step (b) and the difference stored in the nonvolatile memory.

8. The method as set forth in claim 1, wherein the desired optical power is used for either one of a data recording mode, a data playback mode, and a disc discrimination mode.

9. A method for controlling an optical power level, comprising the steps of:
    a) increasing a control value of a driving signal generator for driving a pickup unit to output an optical power until the driving signal generator starts to generate a driving voltage; and
    b) setting the increased control value at which the driving signal generator starts to generate the driving voltage as an offset value for setting up a desired optical power of the pickup unit; and
    c) calculating a control value for generating the desired optical power of the pickup unit based on the offset value, wherein the step (c) includes the steps of:
        c1) applying a predetermined control value and measuring a corresponding optical power of the pickup unit; and
        c2) calculating the control value for generating the desired optical power based on the predetermined control value, the measured optical power corresponding to the predetermined control value, and the offset value,
    wherein the control value for generating the desired optical power in the step (c2) is calculated by the following equation:

$$DAC_{DSL} = DAC_{offset} + \frac{DSL}{DSL_1} \times (DAC_1 - DAC_{offset}),$$

where DSL is the desired optical power, $DAC_{DSL}$ is the control value for generating the desired optical power, $DAC_{offset}$ is the offset value, $DAC_1$ is the predetermined control value, and $DSL_1$ is the measured optical power corresponding to $DAC_1$.

* * * * *